(12) United States Patent
Gomery

(10) Patent No.: US 9,140,468 B2
(45) Date of Patent: Sep. 22, 2015

(54) SOLAR POWER UNIT

(76) Inventor: Michael Lee Gomery, Montebello, VA (US)

( * ) Notice: Subject to any disclaimer, the term of this patent is extended or adjusted under 35 U.S.C. 154(b) by 379 days.

(21) Appl. No.: 12/453,348

(22) Filed: May 7, 2009

(65) Prior Publication Data

US 2010/0282295 A1    Nov. 11, 2010

(51) Int. Cl.
| | |
|---|---|
| H02S 40/22 | (2014.01) |
| H01L 31/0236 | (2006.01) |
| F24J 2/16 | (2006.01) |
| F24J 2/54 | (2006.01) |
| H01L 31/042 | (2014.01) |
| H01L 31/054 | (2014.01) |
| F24J 2/36 | (2006.01) |
| F24J 2/38 | (2014.01) |
| F24J 2/46 | (2006.01) |

(52) U.S. Cl.
CPC .. *F24J 2/541* (2013.01); *F24J 2/16* (2013.01); *H01L 31/0547* (2014.12); *H02S 20/00* (2013.01); *F24J 2/4638* (2013.01); *Y02E 10/47* (2013.01); *Y02E 10/52* (2013.01)

(58) Field of Classification Search
CPC .... Y02E 10/60; H01L 31/054; H01L 31/0687
USPC .......... 136/244, 245, 246, 248, 259; 126/602, 126/605, 608, 576
See application file for complete search history.

(56) References Cited

U.S. PATENT DOCUMENTS

| | | | | | |
|---|---|---|---|---|---|
| 3,419,434 | A | * | 12/1968 | Colehower ................... | 136/246 |
| 3,982,527 | A | * | 9/1976 | Cheng et al. ................. | 126/690 |
| 4,152,174 | A | * | 5/1979 | Ludlow ........................ | 136/246 |
| 4,236,937 | A | * | 12/1980 | Wihl ............................. | 136/246 |
| 4,289,118 | A | * | 9/1981 | Stark ............................ | 126/577 |
| 4,337,758 | A | * | 7/1982 | Meinel et al. ................ | 136/246 |
| 4,410,757 | A | * | 10/1983 | Stamminger et al. ........ | 136/248 |
| 4,445,049 | A | * | 4/1984 | Steigerwald ................... | 307/45 |
| 4,446,852 | A | * | 5/1984 | Steigelmann ................ | 126/664 |
| 4,454,371 | A | * | 6/1984 | Folino .......................... | 136/246 |
| 4,520,794 | A | * | 6/1985 | Stark et al. ................... | 126/684 |
| 4,611,914 | A | * | 9/1986 | Homma ........................ | 136/291 |
| 4,713,492 | A | * | 12/1987 | Hanak .......................... | 136/245 |
| 5,520,747 | A | * | 5/1996 | Marks ........................... | 136/245 |
| 6,971,756 | B2 | * | 12/2005 | Vasylyev et al. ............. | 126/692 |

(Continued)

OTHER PUBLICATIONS

Roth et al, Design and construction of a system for sun-tracking, 2004, Renewable Energy 29 pp. 393-402.*

*Primary Examiner* — Jonathan Johnson
*Assistant Examiner* — Andrew Golden
(74) *Attorney, Agent, or Firm* — Russell O. Paige; Richard S. Toikka; Farkas+Toikka, LLP

(57) ABSTRACT

A solar power unit having the following features: It can rotate on an axle to face the sun The solar collectors are arranged in a stepped shape. It has mirrors that can fold out to increase the area over which sunlight is collected. There is a protective bonnet that can cover the solar collectors during inclement weather. The invention has a semi-cylindrical main body that rests on a stand, supported by an axle on which it can pivot to track the sun. The stepped solar collectors are on the upper half of the main body and are covered by the mirrors when they fold in. A first embodiment has a battery that stores electricity generated by sunlight and an inverter for converting direct current from the battery to alternating current. A second embodiment has parabolic collectors that heat water to create high pressure steam that is used to generate electricity.

12 Claims, 9 Drawing Sheets

(56) References Cited

U.S. PATENT DOCUMENTS

| | | | |
|---|---|---|---|
| 2004/0140000 A1* | 7/2004 | Cohen et al. | 136/246 |
| 2006/0054162 A1* | 3/2006 | Romeo | 126/600 |
| 2008/0029151 A1* | 2/2008 | McGlynn et al. | 136/249 |
| 2008/0245402 A1* | 10/2008 | Romeo | 136/248 |

* cited by examiner

SOLAR POWER UNIT

CROSS REFERENCE TO RELATED APPLICATIONS

Not Applicable

STATEMENT REGARDING FEDERALLY SPONSORED RESEARCH OR DEVELOPMENT

Not Applicable

THE NAMES OF PARTIES TO A JOINT RESEARCH AGREEMENT

Not Applicable

INCORPORATION BY REFERENCE OF MATERIAL SUBMITTED ON A COMPACT DISK

Not Applicable

BACKGROUND OF THE INVENTION (1) Field of the Invention

The present invention relates to an apparatus for capturing the energy of solar radiation.

(2) Description of Related Art including information disclosed under 37 CFR 1.97 and 1.98.

The physics of solar collectors and conversion of solar energy to electrical and mechanical power is well understood in the prior art. See, e.g., William Stine and Michael Geyer, *Power From The Sun* (2001) (chapters available online at www.powerfromthesun.net). Two major types of solar collection and energy conversion include methods in which (1) solar collectors concentrate sunlight to heat a heat transfer fluid to a high temperature and to generate steam that drives the power conversion system producing electricity ("thermal process") and (2) photovoltaic cells are used to convert sunlight falling directly upon them to electricity ("photovoltaic process"). Stine and Geyer, Chapter 1.

The solar collector is a key element in a solar energy system. The function of a solar collector is to intercept the incoming solar radiation and change it into a useable form of energy that can be applied to meet a specific demand. Id.

Flat plate collectors are a commonly used type of solar collector. Id. Their construction and operation are simple. They also have the advantage of absorbing both energy coming directly from the disc of the sun and also diffuse and reflected energy coming from other directions. Id. Flat plate thermal collectors are seldom tracked to follow the sun's daily path across the sky. Id. However, it is common to see flat-plate photovoltaic panels mounted on mechanisms that track the sun about one tilted axis, thereby increasing the daily output of the panels.

When higher temperatures are required, concentrating solar collectors are used. Solar energy falling on a reflective surface (e.g., a mirror) is reflected onto a smaller area before it is converted to heat. The smaller surface can attain higher temperatures before heat loss due to radiation and convection wastes the collected energy. Most concentrating collectors can only concentrate the parallel radiation coming directly from the sun's disk and therefore must follow the sun's path across the sky. For prior art directed to sun tracking systems, see, e.g., Moeller, U.S. Pat. No. 4,223,174 (1980); Alsina, U.S. Pat. No. 6,642,691 (2003); Carroll et al., U.S. Pat. No. 6,886,339 (2005); Simon, U.S. Patent App. Pub. No. 2008/0029148 (2008); and McGlynn et al., U.S. Patent App. Pub. No. 2008/0029151 (2008).

The most important factor driving the solar energy design process is whether the energy it produces is economical.

In designing a solar collection system, the designer is interested in both the insolation or solar irradiance, a measure of the rate at which solar energy reaches a unit area at the earth, and also the irradiation or solar radiation, a measure of how much energy has fallen on a collector over a time interval. Insolation is usually measured in watts per square meter, while irradiation is usually measured in joules per square meter or watt-hours per square meter. Solar irradiance is simply the integration or summation of solar insolation over a time interval.

Solar energy from the sun is available all over the earth; however, the size of the collector needs to be increased to collect sufficient solar energy in regions in which the insolation may be relatively low. It is the primary task of the collection design to assure that the amount, quality and timing of the solar energy collected is appropriate to the user's needs. On the earth's surface there is both direct solar irradiance that comes directly from the disc of the sun and also diffuse irradiance that comes from all other directions, e.g., the downward scattering of solar irradiance as the sun's rays pass through the atmosphere and encounter nitrogen, oxygen, water molecules, water droplets and dust particles. Only flat plate, non-concentrating, collectors and some low-temperature types of concentrators can collect the diffuse component of solar radiation. Stine and Gayer, Ch. 2.

In the design of solar energy systems it is important to predict two angles: (1) the angle of incidence of the sun's rays, i.e., the angle between the sun's rays and a vector normal (perpendicular) to the aperture or surface of the collector and (2) the tracking angle, the amount of rotation required to align one of two axes of a collector normal to the sun's rays. These angles are important because the maximum amount of solar energy that could reach a collector is reduced by the cosine of the angle of incidence, and thus is at a maximum when the angle of incidence is normal or 90 degrees.

With two-axis tracking, the collector aperture will always be normal to the sun thus the angle of incidence will be 90 degrees. With one-axis tracking, the angle of incidence will be less than 90 degrees and will depend generally on the collector's position on the earth and the collector's orientation in space. Stine and Gayer, Ch. 3 and 4.

The prior art in published patents and patent applications is distinguishable from this invention in that:

U.S. Pat. No. 4,223,174 (Douglas E. Moeller, Sep. 16, 1980) discloses a sun-tracking solar energy conversion system. The instant invention is distinguishable at least in that its solar collectors are in a stepped configuration to allow the sun's rays to be collected on both the vertical and horizontal surfaces of the steps and it uses fold-out mirrors to expand the collection surface stuck by the sun's rays.

U.S. Pat. No. 5,576,533 (Wirojana Tantraporn, Nov. 19, 1996) discloses a circuit for converting solar energy into alternating current. The instant invention is distinguishable at least in that it also includes collectors in a stepped configuration with fold-out mirrors and a means for tracking the sun by pivoting about a horizontal axis.

U.S. Pat. No. 4,321,419 (Maurice C. Hanafin, Mar. 23, 1982) discloses a transparent protective cover for a solar panel. The instant invention is distinguishable in that it is not merely a protective cover.

U.S. Pat. No. 5,685,151 (Randy Ross, Nov. 11, 1997) discloses a method and apparatus for collecting, converting, storing and using solar energy, including salt (sodium chloride) as a heat storage medium. The instant invention is distinguishable at least in that it does not require the use of salt, does not use a reflective dish, and has its collectors in a stepped array with fold-out mirrors U.S. Pat. No. 5,787,878 (George D. Ratliff, Jr., Aug. 4, 1998) discloses a solar concentrator including a steam boiler situated on a tower at the center of concentric tracks with mirrors focusing the sun's rays approximately on the boiler. The instant invention is distinguishable at least in that it has a semi-cylindrical configuration with collectors arrayed with straight steps and does not use mirrors to focus the sun's rays on a boiler.

U.S. Pat. No. 5,919,314 (Il Song Kim, Jul. 6, 1999) discloses a sun tracking system based on the principle that power generated is inversely proportional to the angle between the sun and a normal to the surface of the collector and using a solar array for a satellite. The instant invention is distinguishable at least in that it does not use this method to track the sun and also in that it is designed to be used on the earth's surface.

U.S. Pat. No. 6,442,937 (Kenneth W. Stone et al., Sep. 3, 2002) discloses a solar power system that uses mirrors to concentrate solar rays on a single receiver and adjusts the surfaces of the mirrors to even out differences in the flow of energy over time. The instant invention is distinguishable at least in that its mirrors do not concentrate the sun's rays on a single receiver and it has a semi-cylindrical configuration with the solar collectors arrayed in straight steps.

U.S. Pat. No. 6,642,691 (Francesc Sureda Alsina, Nov. 4, 2003) discloses an autonomous interactive solar energy production system that can swivel on two axes to track the sun. The instant invention is distinguishable at least in that it has a semi-cylindrical configuration with the solar collectors arrayed in straight steps with fold-out mirrors.

U.S. Pat. No. 6,886,339 (Joseph P. Carroll et al., May 3, 2005) discloses a solar power collection system with parabolic-trough-shaped mirrors that focus the sun's rays along a focus line and that can rotate on one axis to track the sun. The instant invention is distinguishable at least in that its solar collectors are positioned in a stepped array and its fold-out mirrors do not focus the sun's rays along a focus line.

U.S. Pat. No. 6,930,237 (Gilberto Mattiuzzo, Aug. 16, 2005) discloses a device for converting solar radiation into electric power in which solar panels are retained on multiple supporting arms that protrude from a vertically elongated body. The instant invention is distinguishable at least in that it does not require a vertically elongated body, has a means for tracking the sun and has its collectors arrayed in straight steps with fold-out mirrors.

U.S. Patent Application No. 2008/0029149 (Daniel Simon, Feb. 7, 2008) discloses an apparatus in which solar cells and reflectors are in a stepped array. The instant invention is distinguishable at least in that it has a semi-cylindrical main body which can pivot to track the sun and has collectors in a stepped array with fold-out mirrors allowing the reflected rays to strike the collectors on both the horizontal and vertical steps.

U.S. Patent Application No. 2008/0029151 (Daniel McGlynn et al., Feb. 7, 2008) discloses a solar power system including semiconductor solar cells, trough-shaped or Cassegrain reflectors, a solar tracker, and a heat spreader for cooling the solar cells. The instant invention is distinguishable at least in it has a semi-cylindrical main body with solar collectors in a stepped array with fold-out mirrors.

Japanese Patent No. 2007-150220 (K. Matsura, Jun. 14, 2007) discloses a sunlight reflective apparatus for solar electric power generation having a concave mirror that concentrates sunlight on a solar cell module. The instant invention is distinguishable in that it has a semi-cylindrical main body with solar collectors in a stepped array.

BRIEF SUMMARY OF THE INVENTION

The present invention is a solar power unit, having the following features: (1) it can rotate about a horizontal axis to track the sun; (2) the solar collectors are arranged in a stepped shape; (3) it has mirrors which can fold out at specified angles to increase the area over which sunlight is captured and reflect the sunlight toward the collectors' vertical and horizontal surfaces; (4) it has a protective bonnet that can cover the solar collectors during inclement weather. The invention has a semi-cylindrical main body that rests on a stand supported by a horizontal axis on which it can pivot to track the sun. The stepped solar collectors are on the upper half of the main body and are covered by mirrors when they fold in. A first embodiment of the invention has a battery that stores electricity generated by sunlight and an inverter for converting direct current from the battery to alternating current. A second embodiment has parabolic collectors that heat water to create high pressure steam that is used to generate electricity.

It is a principal object of the invention to provide a means of collecting solar power that can pivot to track the sun.

It is another object of the invention to provide a means of collecting solar power having an array of photovoltaic cells or parabolic collectors in steps to increase the area over which solar energy can be collected.

It is a further objective of the invention to provide a protective bonnet or cover for a solar power unit.

It is a fundamental objective of the invention to provide improved elements and arrangements thereof in an apparatus for the purposes described which is inexpensive, dependable, and fully effective in accomplishing its intended purposes.

These and other objectives of the present invention are readily apparent from the following specifications and drawings.

BRIEF DESCRIPTION OF THE SEVERAL VIEWS OF THE DRAWINGS

Similar reference characters denote corresponding features consistently throughout the attached drawings.

DETAILED DESCRIPTION OF THE INVENTION

The present invention is a solar power unit having a first preferred embodiment using photovoltaic cells and a second preferred embodiment using parabolic collectors.

Figure 1:
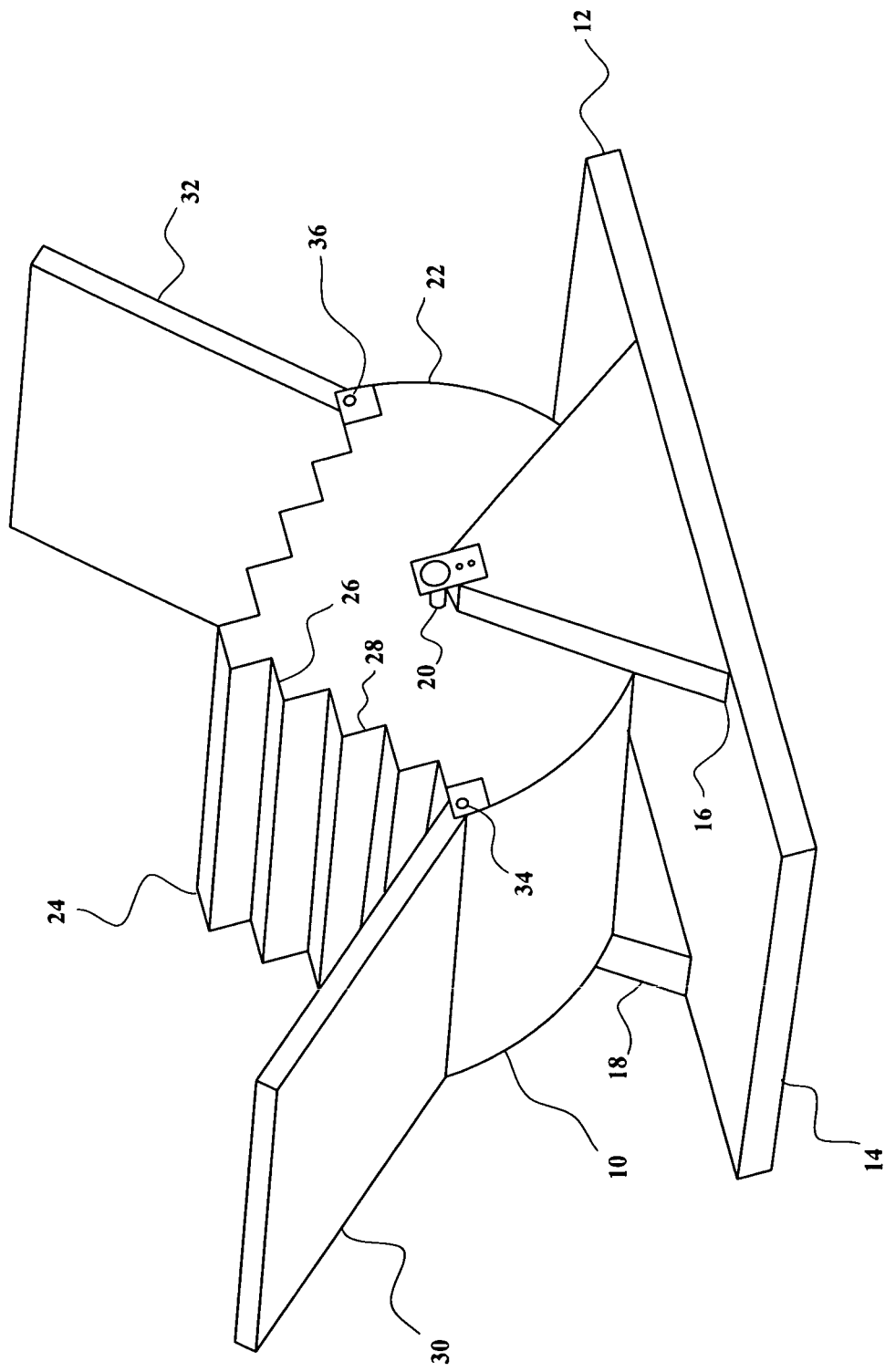
FIG. 1 is a perspective view of the first preferred embodiment of the invention.

FIG. 1 is a perspective view of the first preferred embodiment of the invention 10, showing the base 12 with bottom member 14 and upright members 16 and 18. The axle 20 is retained between the upright members. The main body 22 rotates on the axle. Steps 24 extend upward towards the center of the upper surface of the main body. The steps have alternating horizontal surfaces 26 and vertical surfaces 28, which are preferably at right angles to each other. Photovoltaic cells comprise (or are embedded in) the horizontal and vertical surfaces. As compared with a flat array, the stepped array of the photovoltaic cells increases the surface area over which radiant energy from the sun can be absorbed, and also allows radiant energy to be absorbed from different directions. Mirrors 30 and 32 are connected to the edges of the main body by mirror pivots 34 and 36. When the mirrors are folded out, they increase the area over which the sunlight is captured by the photovoltaic cells. The mirrors may be folded in and out manually or by mechanical or electromechanical means.

Figure 2:
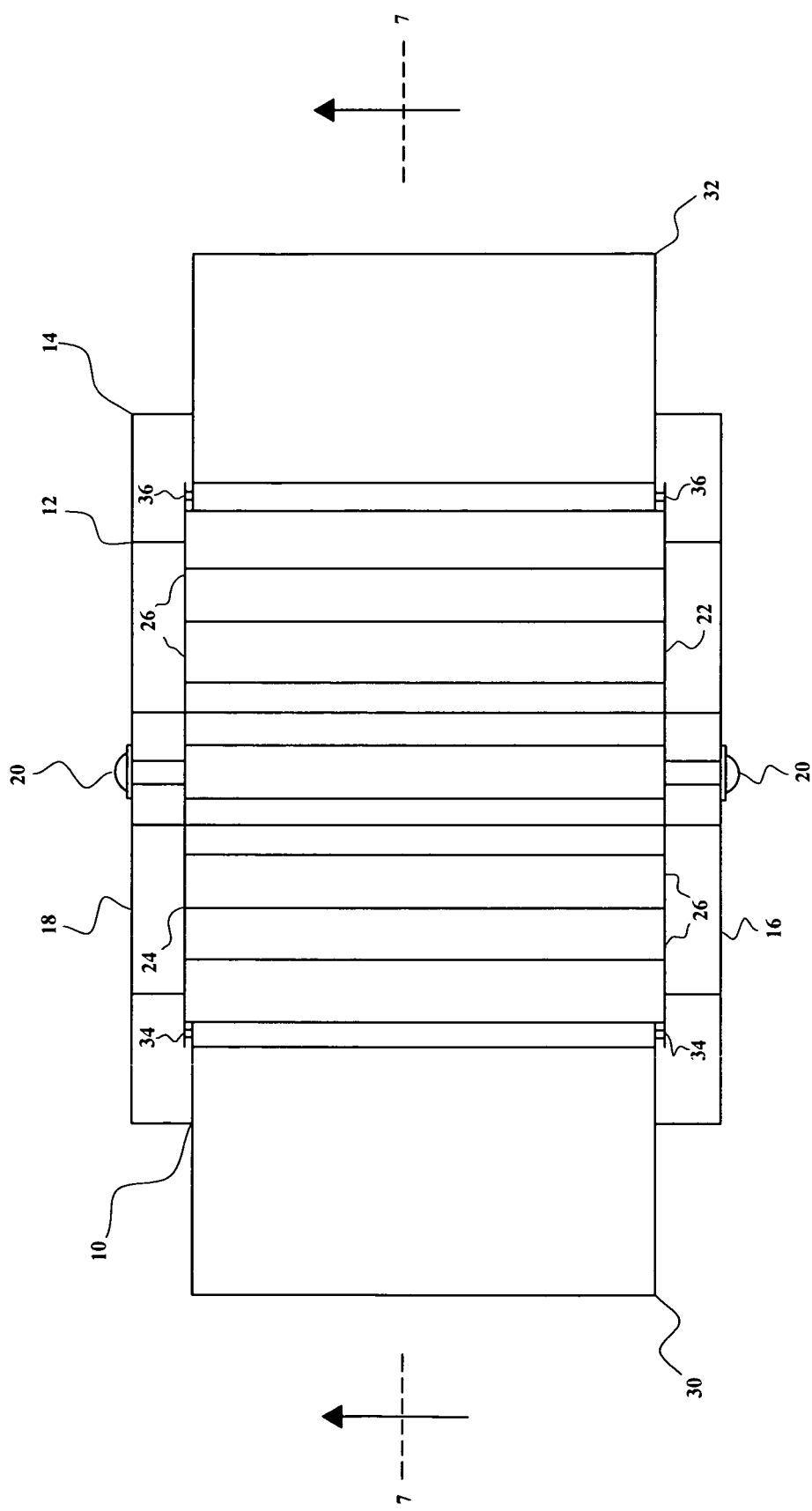
FIG. 2 is a top view of the first preferred embodiment of the invention.
Figure 3:
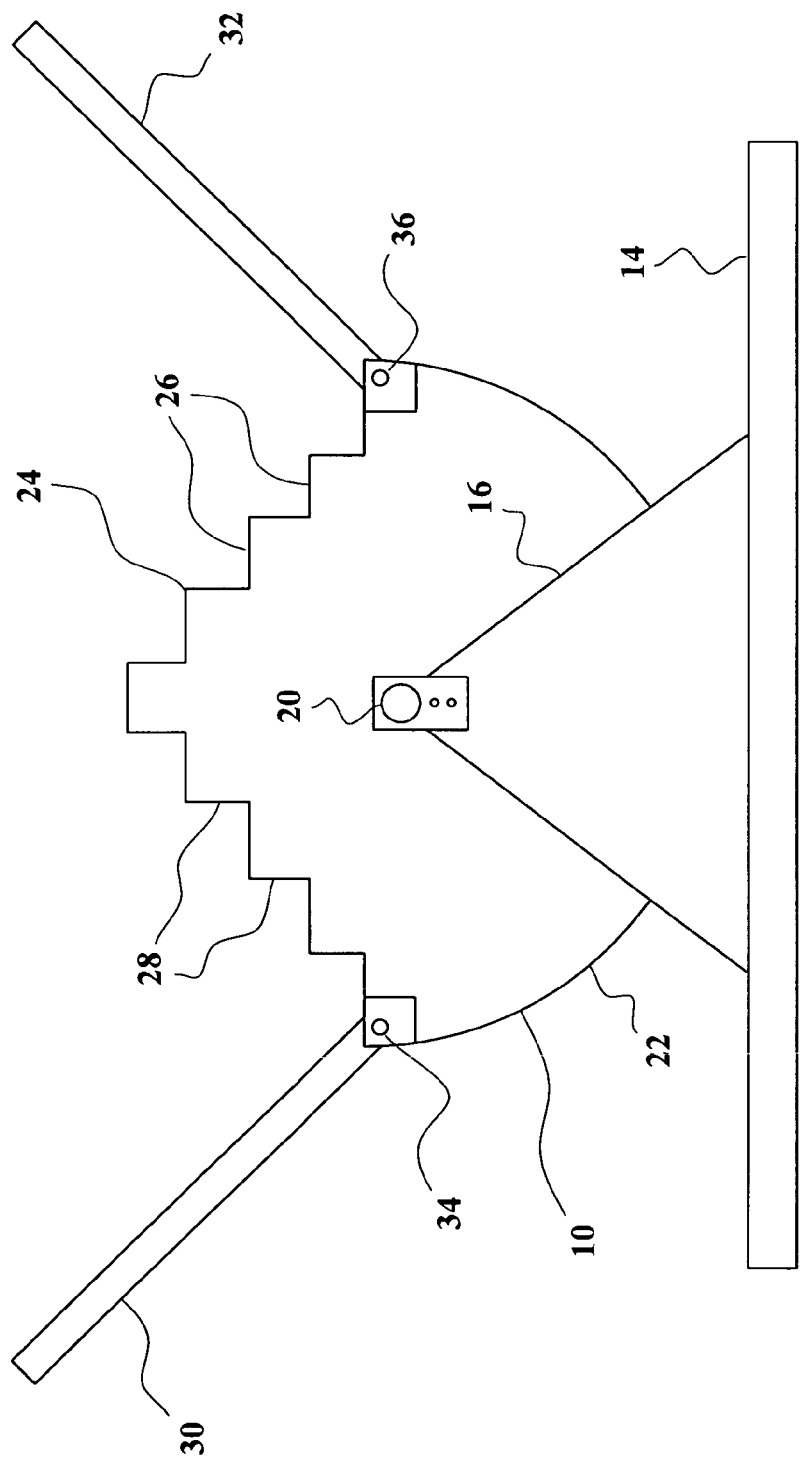
FIG. 3 is a left side elevational view of the first preferred embodiment of the invention, with the right side elevational view being symmetrical.
Figure 4:
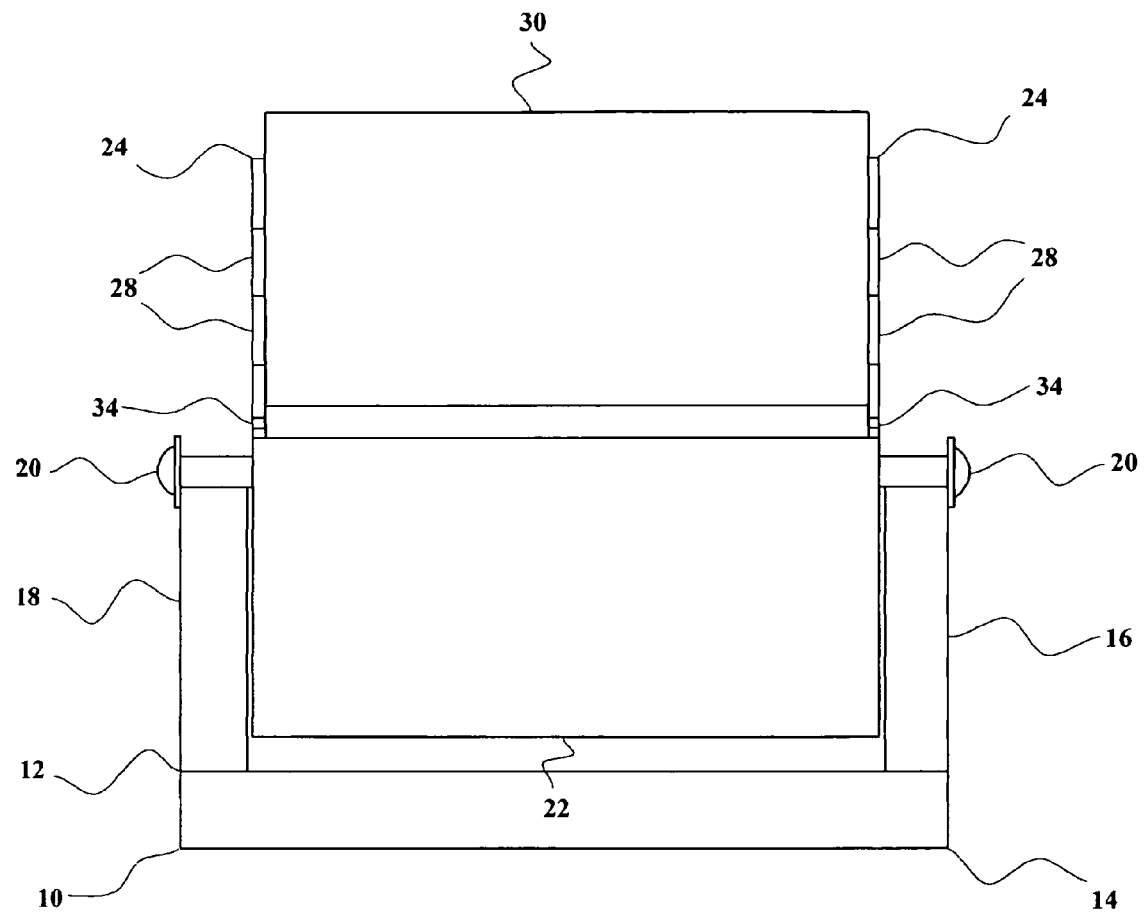
FIG. 4 is a front side elevational view of the first preferred embodiment of the invention, with the rear elevational view being symmetrical.
Figure 5:
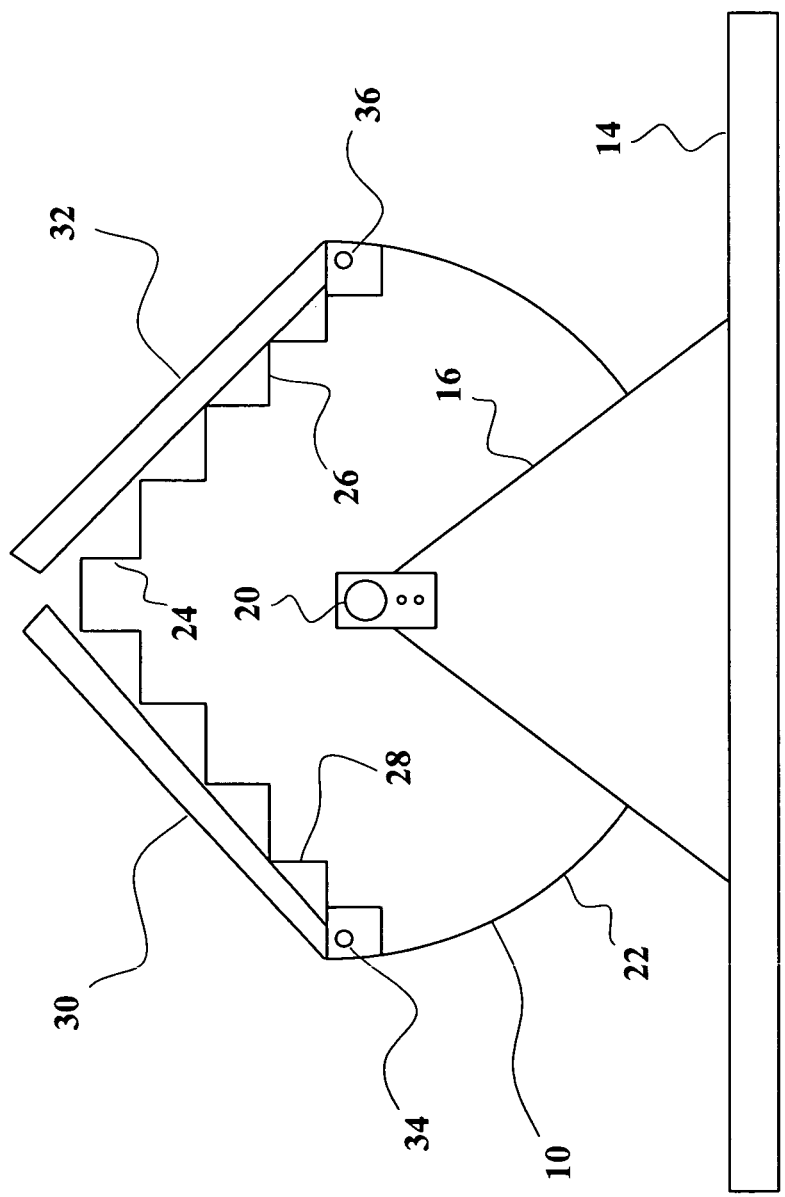
FIG. 5 is a left side elevational view of the first preferred embodiment of the invention, with the mirrors in a closed position.

FIG. 2 is a top view of the first preferred embodiment of the invention. FIG. 3 is a left side elevational view of the first preferred embodiment of the invention, with the right side elevational view being symmetrical. FIG. 4 is a front elevational view of the first preferred embodiment of the invention, with the rear elevational view being symmetrical. FIG. 5 is a left side elevational view of the first preferred embodiment of the invention, showing the mirrors 30 and 32 in a closed position.

Figure 6:
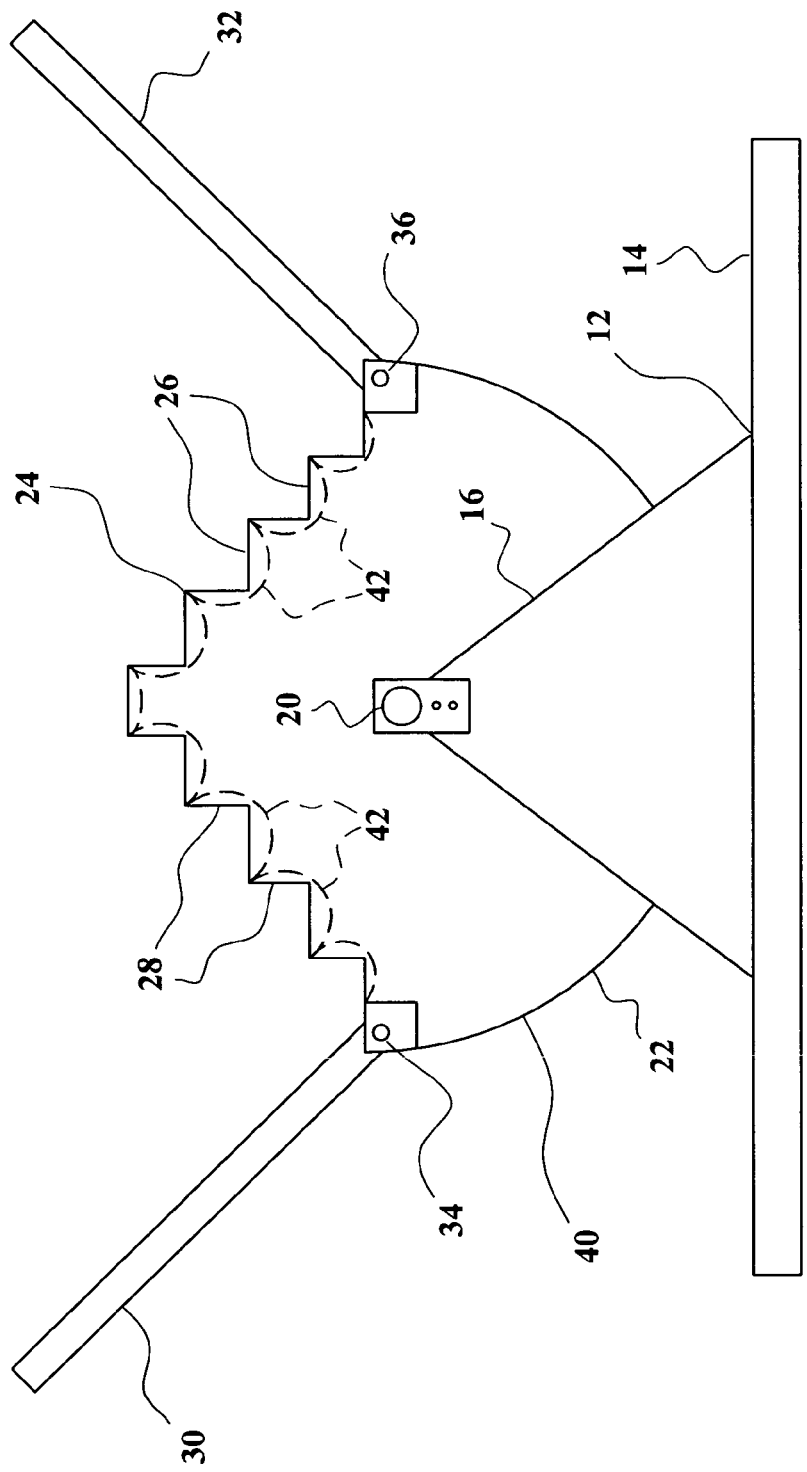
FIG. 6 is a left side elevational view of the second preferred embodiment of the invention.

FIG. 6 is a left side elevational view of the second preferred embodiment of the invention 40, which differs from the first preferred embodiment in having parabolic collectors 42 (shown in broken lines because they are below the surface of the steps) rather than photovoltaic cells.

Figure 7:
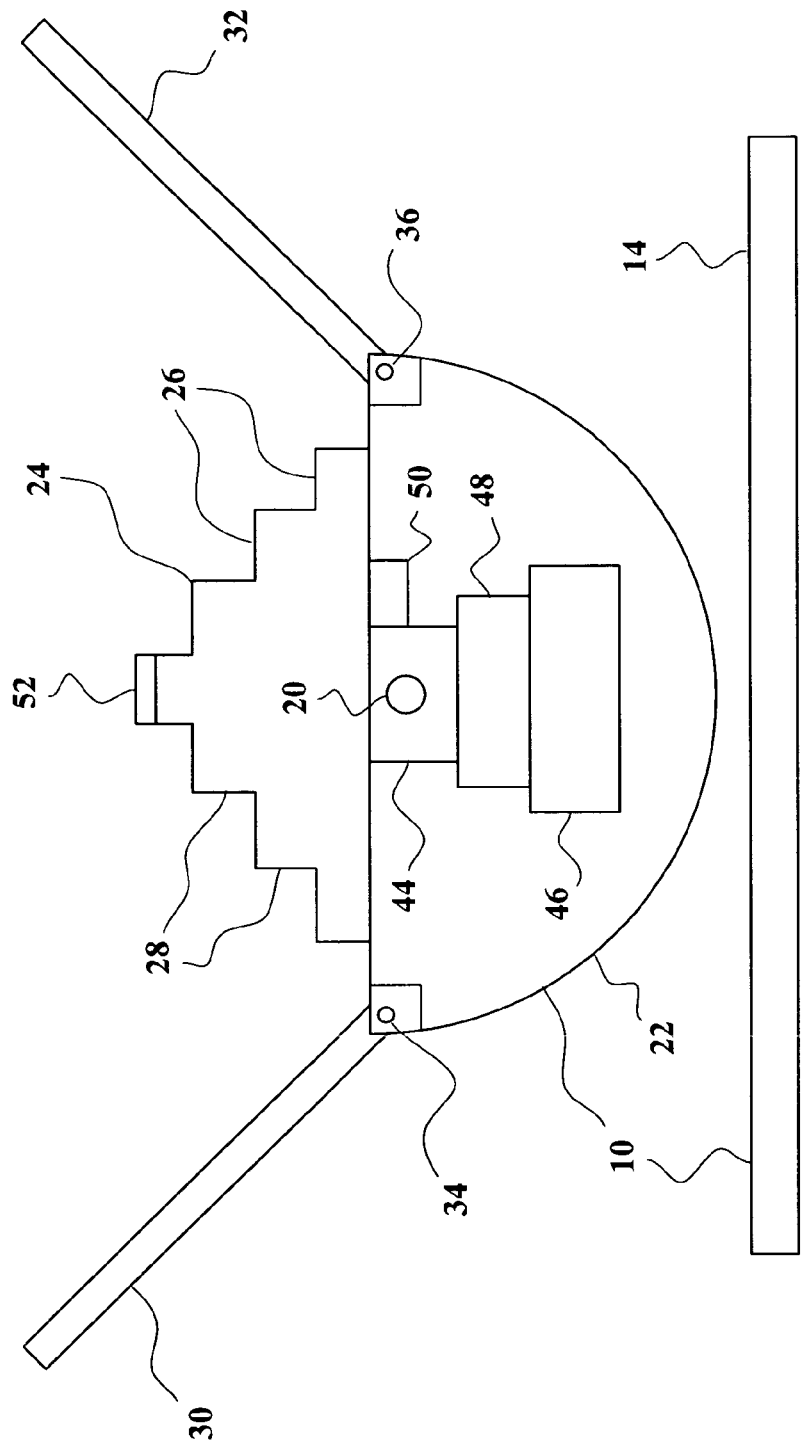
FIG. 7 is a sectional view of the first preferred embodiment of the invention drawn along lines 7-7 of FIG. 2.

FIG. 7 is a sectional view of the first preferred embodiment of the invention drawn along lines 7-7 of FIG. 2. The main body 22 may be rotated manually or by motor 44. Energy generated by the photovoltaic cells is stored in battery 46. An inverter 48 converts direct current from the battery to alternating current. The motor may be controlled by a timer 50 or a solar radiation director 52.

Figure 8:
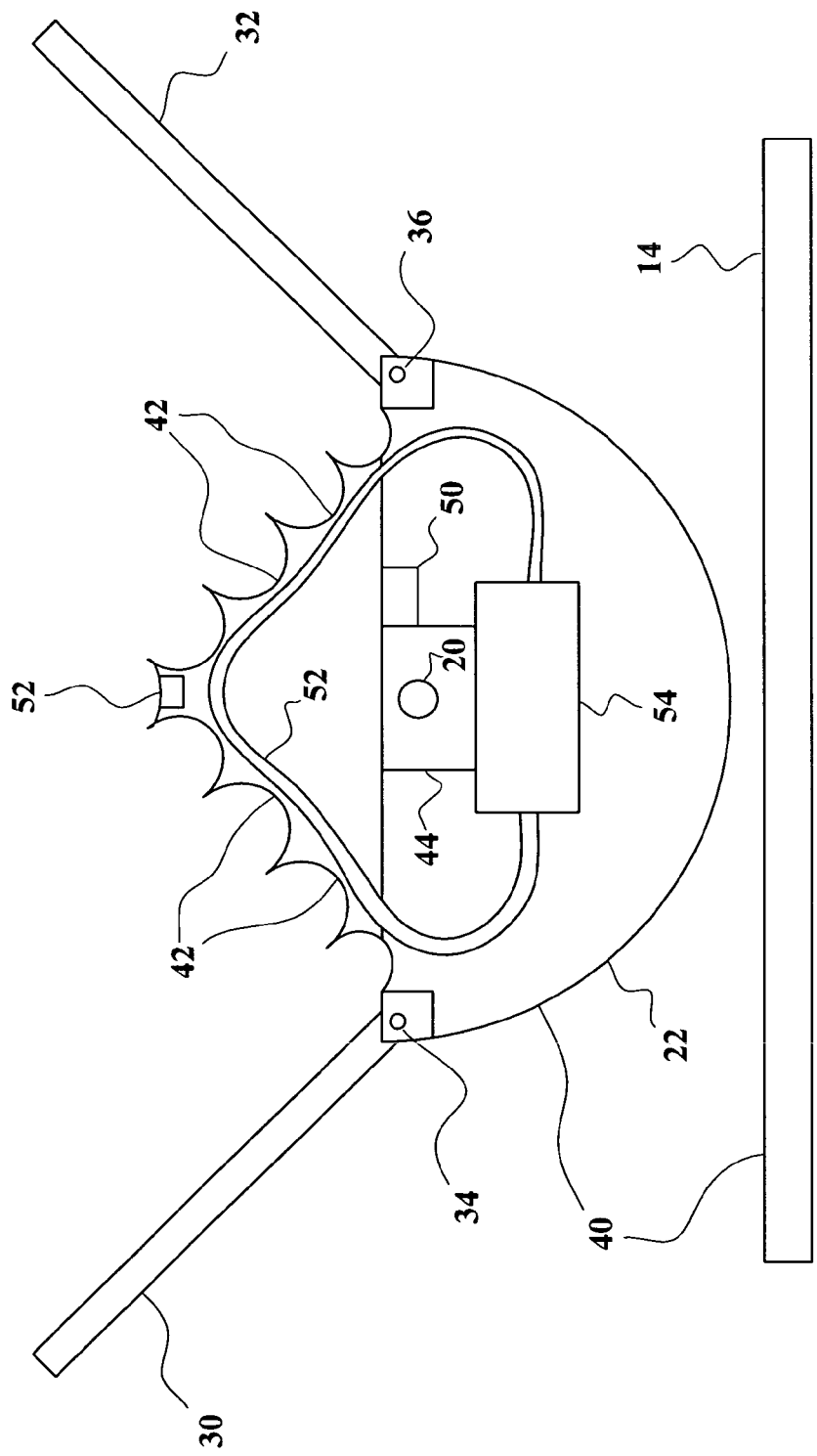
FIG. 8 is a sectional view of the second preferred embodiment of the invention.

FIG. 8 is a sectional view of the second preferred embodiment of the invention 40, drawn along lines equivalent to lines 7-7 of FIG. 2. Radiation from the sun is concentrated by parabolic collectors 42 and heats water (or other fluid) in the pipe (or other conduit) 52 to produce high pressure steam (or other vapor) that is used to generate electricity in the generator 54. Again, the main body 22 may be rotated manually or by motor 44. The motor may be controlled by a timer 50 or a solar radiation detector 52.

Figure 9:
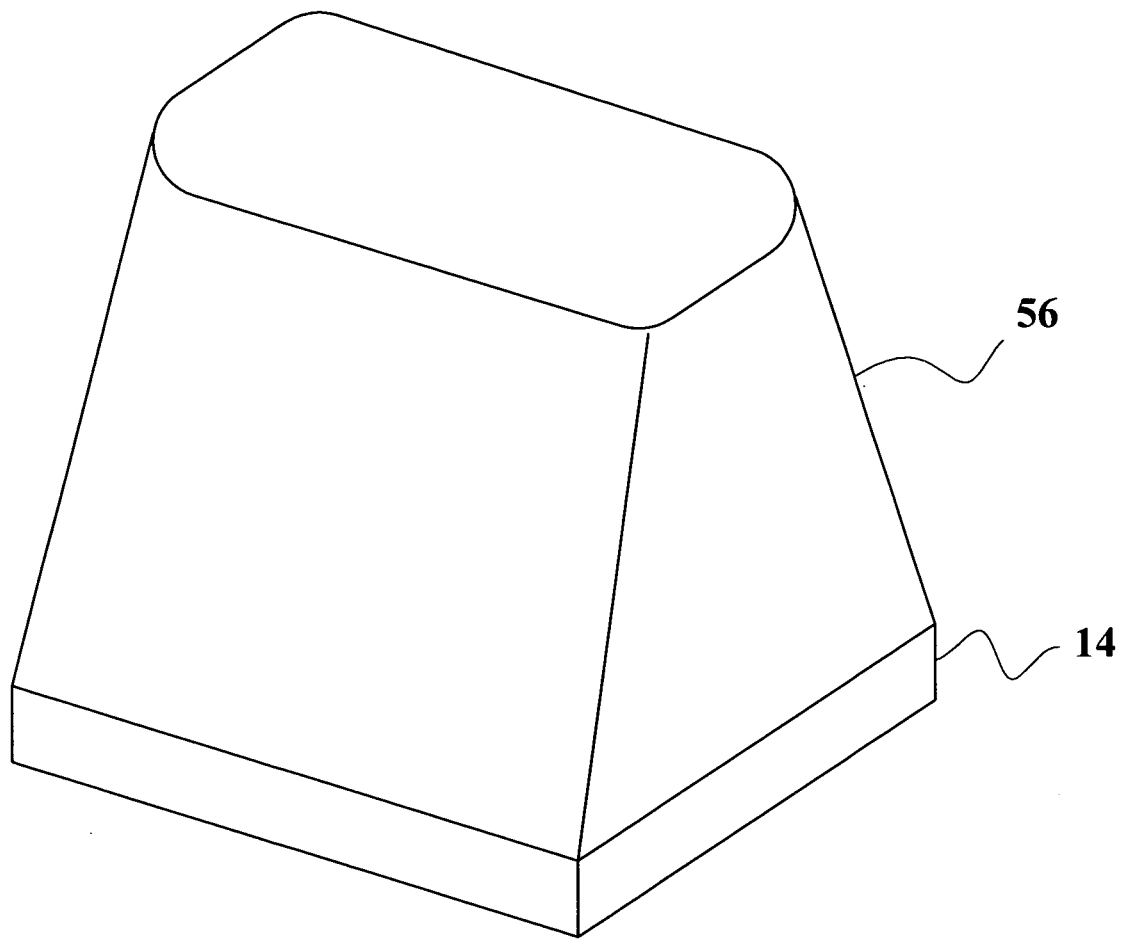
FIG. 9 is a perspective view of either the first or second preferred embodiment covered by the protective bonnet.

FIG. 9 is a perspective view of either the first or second preferred embodiment covered by protective bonnet 56, which may be made of any suitable waterproof material. The protective bonnet may be used during inclement weather, or when the unit is in storage.

It is to be understood that the present invention is not limited to the embodiments described above, but encompasses any and all embodiments within the scope of the following claims.

SEQUENCE LISTING

Not Applicable

I claim:

1. A solar power unit, comprising:
a fixed base defining a horizontal plane;
a main body pivotally connected to said fixed base where said main body can rotate about a horizontal axis to track the sun; and
a plurality of photovoltaic cells in a nonlinear bilateral stepped array on an upper surface of said main body;
where said stepped array comprises said plurality of photovoltaic cells positioned on a plurality of planar surfaces, each one of said plurality of planar surfaces extends substantially the length of said main body in the direction of the horizontal axis, and each one of said plurality of planar surfaces orthogonally abuts at least one adjacent one of said plurality of planar surfaces, so that each one of said plurality of photovoltaic cells orthogonally abuts at least one adjacent one of said plurality of photovoltaic cells.

2. The solar power unit according to claim 1, further comprising at least one of:
means for storing electricity generated by the photovoltaic cells; and
means for converting direct current from the photovoltaic cells to alternating current.

3. The solar power unit according to claim 1, further comprising:
mirrors that can fold out to increase the area where sunlight is collected, where said mirrors direct solar radiation at said plurality of photovoltaic cells from at least a second angle different from the angle of incident solar radiation.

4. The solar power unit according to claim 1, the main body further comprising covering means that can fold over said upper surface of said solar power unit.

5. The solar power unit according to claim 1, wherein the main body is at least one of manually rotatable and rotated by a motor.

6. The solar power unit according to claim 4, further comprising:
removable covering means that can be placed over the solar power unit to protect said solar power unit at least one of
during transport,
during storage, and
from inclement weather.

7. The solar power unit according to claim 1, where the nonlinear bilateral stepped array includes at least one horizontal surface and at least one vertical surface, and said plurality of photovoltaic cells are arranged parallel to and on said at least one horizontal surface and on said at least one vertical surface.

8. The solar power unit according to claim 1, where a lower surface of said main body comprises a cylindrical section about said axis of rotation.

9. The solar power unit according to claim 3, wherein said second angle is at least 45 degrees different from the angle of incident solar radiation.

10. The solar power unit according to claim 1, wherein said plurality of photovoltaic cells includes a first plurality of photovoltaic cells parallel to said horizontal plane, and a second plurality of photovoltaic cells perpendicular to said horizontal plane.

11. The solar power unit according to claim 1, wherein said nonlinear bilateral stepped array is symmetrical about a second axis that is perpendicular to the horizontal axis.

12. The solar power unit according to claim 11, wherein said second axis comprises said angle of incident solar radiation.

* * * * *